United States Patent
Hung et al.

[11] Patent Number: 5,086,035
[45] Date of Patent: Feb. 4, 1992

[54] ELECTRICALLY CONDUCTIVE ARTICLE (I)

[75] Inventors: Liang-Sun Hung, Webster; Dilip K. Chatterjee, Rochester, both of N.Y.

[73] Assignee: Eastman Kodak Company, Rochester, N.Y.

[21] Appl. No.: 475,527

[22] Filed: Feb. 6, 1990

[51] Int. Cl.$^5$ .............................. B32B 9/00
[52] U.S. Cl. ............................ 505/1; 428/457; 428/901; 428/357
[58] Field of Search .......... 428/901, 357, 457; 505/1

[56] References Cited

FOREIGN PATENT DOCUMENTS 0303083 2/1989 European Pat. Off.
0248696 10/1989 Japan ..................................... 505/1

OTHER PUBLICATIONS

Kathikeyan et al., "Plasma Sprayed Superconducting $Y_1Ba_2Cu_3O_{7-x}$ Coatings", J. Phys. D. Appl. Phys., Apr. 27, 1988, p. 1246.

Primary Examiner—Patrick J. Ryan
Assistant Examiner—Elizabeth Evans
Attorney, Agent, or Firm—Carl O. Thomas

[57] ABSTRACT

An electrically conductive article is disclosed comprised of a support, a barrier and a heavy pnictide mixed alkaline earth copper oxide crystalline coating. The support is an austenitic metal alloy of chromium and one or more group VIII period 4 metals, and the barrier is comprised of a high density hafnia layer.

13 Claims, 1 Drawing Sheet

ELECTRICALLY CONDUCTIVE ARTICLE (I)

FIELD OF THE INVENTION

The invention relates to electrically conductive articles. In a more specific aspect the invention relates to electrically conductive articles that exhibit a relatively high superconducting onset transition temperature. Still more specifically this invention relates to articles that exhibit superconductivity at relatively high temperatures.

BACKGROUND OF THE INVENTION

The term "superconductivity" is applied to the phenomenon of immeasurably low electrical resistance exhibited by materials. Until recently superconductivity had been reproducibly demonstrated only at temperatures near absolute zero. As a material capable of exhibiting superconductivity is cooled, a temperature is reached at which resistivity decreases (conductivity increases) markedly as a function of further decrease in temperature. This is referred to as the superconducting onset transition temperature or, in the context of superconductivity investigations, simply as the critical temperature ($T_c$). $T_c$ provides a conveniently identified and generally accepted reference point for marking the onset of superconductivity and providing temperature rankings of superconductivity in differing materials. The highest temperature at which superconductivity (i.e., zero resistance) can be measured in a material is referred to as $T_o$.

As herein employed the terms high superconducting onset transition temperature, high critical temperature and high $T_c$ are employed interchangeably to indicate a material having a superconducting onset transition temperature of greater than 80° C.

Agostinelli et al U.S. Ser. No. 359,306, filed May 31, 1989, titled CONDUCTIVE ARTICLES AND PROCESSES FOR THEIR PREPARATION, commonly assigned, now U.S. Pat. No. 4,950,643, (European patent application 0 334 093, published Sept. 27, 1989, corresponding) discloses electrically conductive articles in which a crystalline heavy pnictide mixed alkaline earth copper oxide is formed on a substrate. The articles exhibit high critical temperatures and superconductivity when the substrate presents a perovskite crystal structure as a coating surface (e.g. a strontium titanate coating surface) or a magnesia or alumina coating surface. To avoid reduction of $T_c$ by less compatible substrates Agostinelli et al proposes the use of barrier layers between the crystalline superconductive oxide layer and the substrate. Suggested barriers include magnesia, a group 4 metal oxide or silicide (particularly zirconia), silver, gold or a platinum metal.

What the art has sought without success are articles in which superconductive copper oxide coatings are present on supports of non-precious metals, particularly period 4 metals.

In Applicants' concurrently filed, commonly assigned patent application, U.S. Ser. No. 475,528, titled ELECTRICALLY CONDUCTIVE ARTICLE (II), an article is disclosed comprised of support, a barrier and an electrically conductive heavy pnictide mixed alkaline earth copper oxide crystalline coating. The support is an austenitic metal alloy of chromium and one or more group VIII period 4 metals, and the barrier is comprised of a zirconia layer containing fissures and a compatible metal oxide located in the fissures.

SUMMARY OF THE INVENTION

In one aspect this invention is directed to an article comprised of a support, a barrier and an electrically conductive heavy pnictide mixed alkaline earth copper oxide crystalline coating, characterized in that the support is comprised of an austenitic alloy of chromium and one or more group VIII period 4 metals and the barrier is comprised of a high density hafnia layer.

By selection of the crystalline coating, the substrate and the barrier materials electrically conductive articles, including those having relatively high $T_c$ levels and those exhibiting superconducting properties, are achieved using alloys of the non-precious metals, which are economically attractive and have the capability of fabrication in varied structural forms. For example, the selected substrate materials particularly lend themselves to the fabrication of flexible articles, such as conductive tapes and wire. For reasons set out in more detail below the support, barrier and conductive cuprate layer selections have shown themselves to be uniquely suited for use together and capable of achieving high superconducting onset transition temperatures not realized with varied selections of materials.

Dimensions of various features of the articles have been exaggerated for ease of visualization.

DESCRIPTION OF PREFERRED EMBODIMENTS

Figure 1:
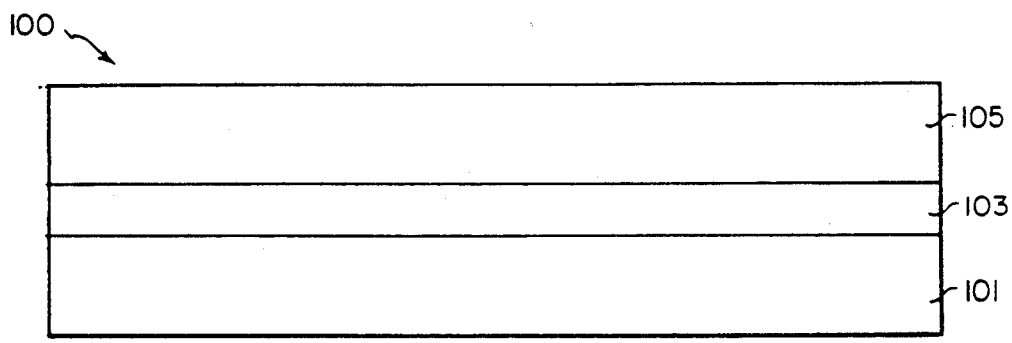
FIG. 1 is a schematic view of an article satisfying the requirements of the invention and FIG. 2 is a schematic view of an alternative embodiment.

Referring to FIG. 1 an article 100 satisfying the requirements of the invention is shown. The article consists of an austenitic metal alloy support 101, a high density hafnia barrier layer 103, and an electrically conductive heavy pnictide mixed alkaline earth copper oxide crystalline coating 105.

Figure 2:
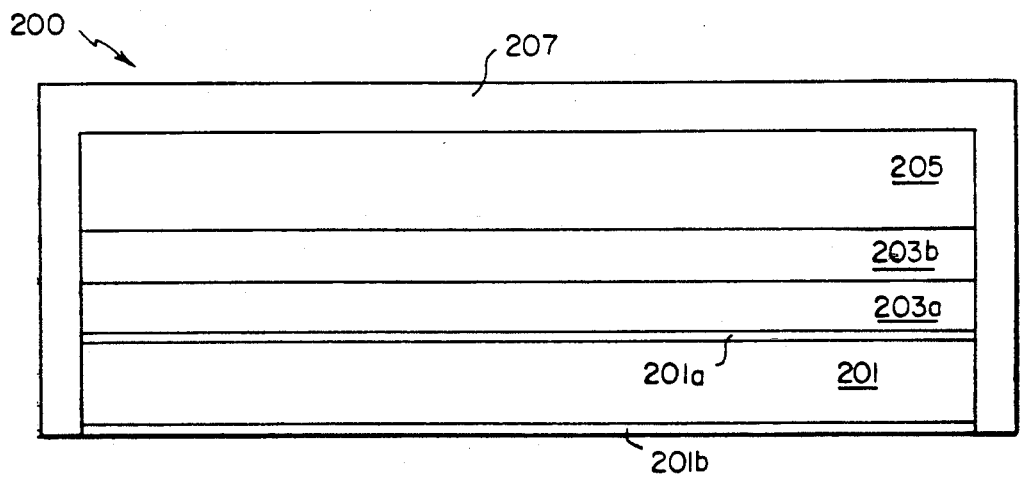

Another embodiment of the invention is shown in FIG. 2. The article 200 consists of an austenitic metal alloy support 201, which has thin oxide layers 201a and 201b formed on its opposite faces during heating to temperatures required to crystallize the electrically conductive heavy pnictide mixed alkaline earth copper oxide coating 205. Interposed between the conductive coating and the support are layers 203a and 203b. The layer 203a is a high density hafnia barrier layer. The layer 203b can be an auxiliary barrier layer or a layer having as its purpose to facilitate crystallization of the conductive layer. An external coating 207 cooperates with the support to surround the electrically conductive crystalline layer to protect it against ambient contaminants, such as moisture.

The electrically conductive articles of this invention incorporate supports comprised of an austenitic alloy of chromium and one or more group VIII period 4 metals. Austenitic alloys exhibit a face centered cubic crystal lattice structure that renders the alloys more highly resistant to oxidation at high temperatures than other crystalline forms of these alloys. For facilitating article fabrication it is particularly contemplated to employ those alloys that resist oxidation when subjected to temperatures of at least 800° C. in air for up to 10 minutes. In practice the alloys may be subjected to even higher temperatures (e.g., 850° C. or more), but usually for somewhat shorter time periods.

The austenitic alloys resist oxidation by reacting slowly, if at all, with oxygen from ambient air. In some instances oxidation resistance can be attributed directly to a low initial and continued rate of oxidation of elemental metal. In other instances the formation of a thin surface oxide layer, seldom more than about a 1000 Å in thickness, acts as a passivant retarding or preventing further oxidation. In this instance the supports exhibit thin surface oxide layers corresponding to layers 201a and 201b, described above.

Oxidation resistant austenitic alloys have the common feature of containing chromium in combination with one or more group VIII period 4 metals—that is, at least one of iron, nickel and cobalt. Chromium concentrations range from about 5 to 30 percent. (Except as otherwise stated, all percentages are to be understood as being percent by weight, based on total weight.) Austenitic stainless steels typically contain from about 16 to 25 percent chromium and up to about 20 percent nickel, the balance being accounted for principally by iron with minor proportions of optional modifying metals often also being present. By displacing all or part of the iron with nickel, cobalt or a mixture of both, austenitic alloys can be formed known as superalloys. Superalloys in which the iron is wholly or partially replaced by nickel and cobalt, if present, is limited to 20 percent typically contain from 5 to 25 chromium while superalloys which contain up to 22 percent nickel with the balance of the group VIII metal being cobalt typically contain from about 19 to 30 percent chromium. Other, optional metals that are commonly included in the austenitic alloys to enhance various properties include one or both of molybdenum and tungsten in concentrations of up to 12 percent, often incorporated as carbides; one or both of aluminum and titanium in concentrations of up to 6 percent, niobium in concentrations of up to 5 percent, often incorporated as a carbide; and tantalum in concentrations of up to 12 percent, often incorporated as a carbide. Manganese and silicon concentrations in austenitic stainless steels can range up to 20 percent, but are most commonly in the 1 to 5 percent range. In superalloys manganese and silicon, if present, seldom account for as much as 2 percent of the alloy. Nitrogen, carbon, phosphorus, sulfur, zirconium, boron and rare earths also are common ingredients at concentrations usually well below 1 percent.

Specific examples of suitable austenitic stainless steels are listed in the *Metals Handbook*, American Society for Metals, 1985, Table 3 at page 15-2 and Table 1 at page 16-2, the disclosure of which is here incorporated by reference. Specific examples of suitable austenitic superalloys are listed in the *Metals Handbook*, cited above, in Table 2, page 61-7, also incorporated by reference.

In addition to their resistance to oxidation at the high temperatures required to achieve crystallization of the electrically conductive oxide layer and at ambient temperatures, the austenitic alloys offer the advantage of being much more economical to use than the platinum metals, silver and gold. Further, the austenitic alloys permit supports to be fabricated that are both flexible and strong. The article supports can, for example, readily be fabricated in the forms of tapes or wires, allowing curved configurations, such as those required in winding and spooling, both before and after article fabrication. While the austenitic alloy supports can be of any thickness convenient for their intended application, for use in flexible form, such as a tape, support thicknesses in the range of from about 5 to 500 μm, preferably 50 to 300 μm, are contemplated.

If it is attempted to coat and crystallize the electrically conductive crystalline oxide layer while in direct contact with the austenitic alloy surface of the support, degradation of electrical conduction properties occur. It is, for example, impossible to achieve a high $T_c$ or superconductive crystalline oxide layer when heating of the oxide layer to its crystallization temperature is undertaken with the oxide layer in direct contact with the austenitic alloy of the support.

It is therefore contemplated to interpose a barrier layer between the austenitic alloy support and the electrically conductive crystalline oxide layer. It is a surprising discovery of this invention that high density hafnia is capable of forming an effective barrier to prevent austenitic alloy contamination of the electrically conductive crystalline oxide layer, whereas zirconia, a commonly used barrier material, is ineffective. This divergence in utility is all the more suprising when it is considered that zirconium and hafnium are members of the same group of the Periodic Table of elements, exhibit virtually identical atomic diameters, and exhibit virtually identical chemical reaction characteristics.

Because of the close chemical and physical similarities of hafnia and zirconia, it is appreciated that some small amounts of zirconia are always present in hafnia. Optical grade hafnia, the purest form of hafnia commercially available, contains $3 \times 10^{-4}$ mole of zirconia per mole of hafnia while reagent grade hafnia, acceptable for the overwhelming majority of applications requiring hafnia, usually contains slightly less than $2 \times 10^{-2}$ mole of zirconia per mole of hafnia. As employed herein the term "hafnia" contemplates the presence of minor amounts of zirconia. Since hafnia is relatively more expensive than zirconia, it is specifically contemplated to substitute minor amounts of zirconia for hafnia. Hafnia compositions are contemplated that satisfy the relationship $$Hf_{1-z}Zr_zO_2 \qquad (I)$$

where z ranges from the impurity levels noted above up to 0.3, most preferably to 0.2, and optimally to 0.1.

Unlike zirconia layers, the hafnia barrier layers exhibit high density. By high density it is meant that hafnia exhibits a density that is at least 90 percent, preferably at least 99 percent, of its theoretical density. The theoretical density of a hafnia layer is that which results when the entire displacement volume of the layer, the product of the length, width and thickness dimensions of the layer, is occupied by hafnia. Any pores, cracks or other discontinuities in the hafnia layer dramatically reduce its observed density, based on displacement volume.

To achieve high hafnia densities in the barrier layers it is necessary to employ a coating procedure that avoids pores, cracks and other discontinuities. Therefore, coating procedures that produce hafnia in situ by the deposition of hafnium compounds containing a moiety subsequently removed by volatilization on heating do not lend themselves to high density hafnia coatings. More specifically, metalorganic deposition techniques, such as those disclosed in EPO 0 334 093, cited above, are not suited to forming high density hafnia coatings.

Even coating procedures which succeed in initially depositing high density hafnia can fail on heating the conductive oxide layer to its crystallization temperature unless localized internal stresses are annealed out of the high density hafnia layer as it is formed. As demonstrated in the Examples below, an electron beam deposition technique has been employed that creates a high density hafnia layer capable of withstanding temperatures necessary for crystallization of the conductive oxide layer. As the Examples further demonstrate, this procedure has not been effective to produce high density zirconia barrier layers. Rather, the zirconia layers produced by similar coating techniques have been observed to be riddled with mechanical defects, probably attributable to stress fractures created by heating to crystallization temperatures.

The high density hafnia barrier layer can be deposited in any convenient thickness capable of providing a continuous coating. For ideally smooth support coating surfaces thicknesses of at least about 2000 Å are necessary to achieve a continuous layer. In practice, the surface roughness of the support can significantly increase the thickness of the high density hafnia layer required to insure separation of the support and the electrically conductive crystalline oxide coating. For an unpolished austenitic alloy support surface a barrier layer thickness of about 1 $\mu$m is preferred to insure reliable separation of the support and conductive crystalline oxide coating.

There is, of course, no theoretical maximum barrier layer thickness. For articles that are unlikely to be flexed in use the barrier layer can be of any convenient thickness. In forming flexible articles, such as those intended to be spooled or wound, it is preferred to limit the thickness of the barrier layer so that it retains the required flexibility. High density hafnia layer thicknesses in the range of from 1 to 3 $\mu$m, preferably about 1 to 2 $\mu$m, are specifically contemplated for incorporation in flexible articles satisfying the requirements of the invention. Even when the articles are not intended to be flexed in use, there is usually no advantage to increasing the thickness of the dense hafnia layer.

Onto the barrier layer is coated a heavy pnictide mixed alkaline earth copper oxide (hereinafter also referred to by the acronym PAA'C oxide) that is converted by heating after coating into a crystalline electrically conductive layer. PAA'C oxides are one class of a variety of cuprate oxides observed to exhibit relatively high $T_c$ and superconductivity characteristics, including rare earth alkaline earth copper (RAC) oxides, including those exhibiting $K_2NiF_4$, 1-2-3 (that is, $R_1A_2C_3$) and 1-2-4 (that is, $R_1A_2C_4$) crystal structures as well as thallium mixed alkaline earth copper (TAA'C) oxides, such as 2-2-2-3 thallium calcium barium copper oxide, reported to have a $T_c$ of 125° C., the highest reproducible $T_c$ reported to this date.

The selection of PAA'C oxides to form the crystalline conductive layer of the articles of this invention is advantageous in view of their relatively high onset transition superconductivity temperatures in their 2-2-1-2 and 2-2-2-3 crystalline forms. However, selection of an electrically conductive crystalline oxide coating based on $T_c$ alone would not lead to selection of PAA'C oxides, since at least the thallium class of cuprates are known to have higher $T_c$ characteristics.

PAA'C oxides satisfy the requirements of this invention by reason of their ability to crystallize to electrically conductive forms in air at temperatures beginning at about 800° C. This avoids or minimizes the risk of oxidizing the austenitic alloy forming the support, leading to reduction of its flexibility and ductility as well as minimizing any risk of unwanted interactions between the support and crystalline oxide layer. By contrast, crystallization of RAC oxides are typically in the range of from about 900° to 1100° C. The TAA'C oxides typically require heating in the temperature range of 850° to 900° C.

The PAA'C oxides are also advantageous in that they require no special post-crystallization annealing or oxygen enrichment to achieve desirable high $T_c$ and superconductive properties. Generally crystallizations in air without resorting to any particular temperature ramping or atmosphere control on cooling are acceptable to achieve satisfactory conductivity characteristics.

Of the PAA'C oxides it is preferred to form those which exhibit 2-2-1-2 and 2-2-2-3 crystal structures. The latter exhibit the art recognized advantage of higher superconducting onset transition temperatures, but the former are often preferred in practice, since the 2-2-1-2 crystal structure is more stable and can therefore be prepared over a wider range of conditions and on a greater variety of substrate materials. More importantly, for this application the 2-2-1-2 crystalline forms of PAA'C oxides are preferred, since crystallizations can be effected with less thermal energy, reflected in somewhat lower temperatures, heating times or a combination of both.

All coating compositions and procedures known in the art to produce crystalline PAA'C oxide 2-2-1-2 and 2-2-2-3 crystal structures can be employed in the art, subject only to the requirement that crystallization temperatures be maintained below levels that would damage the support. Generally maintaining crystallization temperatures at or below about 850° C. in a time period of 10 minutes or less satisfy this requirement, although some of the more stable austenitic alloys are expected to resist oxidation under somewhat more severe crystallization conditions.

In PAA'C oxides P represents an atom of a heavy pnictide, typically bismuth and, optionally, less than 10 mole percent (preferably less than 5 mole percent) antimony. Lead has been suggested as a possible replacement for a minor amount of bismuth or antimony. A in the PAA'C oxide acronym typically represents strontium while A' typically represents calcium. Magnesium has been employed as a replacement for calcium, but is not preferred, since it reduces superconducting onset transition temperatures. At least a minor amount of strontium is sometimes replaced by barium. The alkaline earth metals are to a limited extent interchangeable in the crystalline lattice without adversely affecting electrical conductivity or superconductivity. Thus even though strontium and calcium, for example, do not satisfy a 2:1 or 1:1 molar ratio, the 2-2-1-2 and 2-2-2-3 crystal lattices, respectively, can nevertheless remain intact. C in the PAA'C oxide acronym is copper. It has been recently recognized that lithium can replace a minor amount of alkaline earth and/or copper in the crystal structure.

Specifically preferred PAA'C oxides are those that exhibit a crystal structure corresponding to that of superconductive 2-2-1-2 barium strontium calcium copper oxide. Preferred molar metal ratios of oxide compositions capable of forming the 2-2-1-2 crystal structure are defined by the formula:

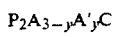 (II)

where
y is 0.5 to 1.5 and
P, A, A' and C are as noted above.

Useful PAA'C oxides and procedures for forming coatings of these oxides are disclosed by EPO 0 334 098, cited above, which relates primarily to forming thin superconductive films having a thickness of 5 μm or less (preferably 1.0 μm or less); Strom U.S. Ser. No. 291,921, filed Dec. 29, 1988, now abandoned in favor of U.S. Ser. No. 556,520, filed July 20, 1990, now allowed titled SUPERCONDUCTING THICK FILMS FOR HYBRID CIRCUITRY APPLICATIONS, which relates to superconductive thick films having a thickness of at least 5 μm; West German published patent application 3,803,530; European published applications 0 330 305A, 0 331 292A and 0 330 324A; Japanese Kokai 1,192,759A (filed Jan. 26, 1988); and R. Dagani, "Improved Superconductor Properties, Technology Bring Applications Closer", C&EN, Jan. 1, 1990, pp. 24-27; the disclosures of which are here incorporated by reference.

Crystalline PAA'C oxide layer thicknesses are contemplated to be at least about 0.3 μm, preferably at least about 0.5 μm. For flexible articles it is preferred that the conductive crystalline oxide coatings be limited to less than about 10 μm in thickness, preferably less than 5 μm in thickness, and optimally less than 1 μm in thickness.

While the high density hafnia is effective when employed as the sole layer separating the austenitic alloy support and the conductive crystalline oxide coating, it is recognized that an auxiliary barrier layer can be employed in combination with the high density hafnia. The auxiliary barrier layer can take the form of a thin layer of another known barrier material. An auxiliary barrier layer can act as a filler for any random pores, cracks or other discontinuities in the high density hafnia layer. When the auxiliary barrier layer overlies the high density hafnia layer, it necessarily forms the surface on which the conductive oxide coating is crystallized. Therefore, auxiliary barrier layer materials are preferably chosen to facilitate the intended crystallization of the overlying PAA'C oxide coating. Auxiliary barrier materials such as magnesia (MgO), strontium titanate (SrTiO$_3$), lanthanum aluminate (LaAlO$_3$), zirconia (ZrO$_2$), potassium tantalate (KTaO$_3$) and similar oxide coatings are specifically contemplated. These auxiliary barrier layer materials can be coated by any convenient conventional technique. Auxiliary barrier layer coatings having the lowest attainable level of discontinuities are favored. However, even if discontinuities in the auxiliary layer are relatively high in comparison to discontinuities in the high density hafnia layer, there is a very low probability of discontinuities in both layers occurring at exactly the same location.

The combined thickness of the high density hafnia layer and the auxiliary barrier layer should not exceed 3 μm, preferably 2 μm when the flexible conductive articles are being formed. In forming flexible articles the thickness of the auxiliary barrier layer is preferably kept to a minimum compatible with achieving a continuous coating, typically in the range of from about 1000 to 3000 Å.

Another optional feature that can be employed to form the articles of this invention are crystal growth promoting agents. Lithium and sodium are both recognized to act as crystal growth promoting agents. These alkali metals in the form of thermally decomposable salts, preferably including an anionic portion that can be volatilized below crystallization temperatures, such as a carboxylate, halide, nitrate or the like, are contemplated. The crystal growth promoting agent can be incorporated in the PAA'C oxide layer as it is initially coated or coated over the high density hafnia prior to forming the PAA'C oxide coating. Even if coated initially as a separate layer, no separate crystal growth promoting agent layer remains in the article after heating to crystallization temperatures.

Instead of employing an alkali metal salt as a crystal growth promoting agent, is is specifically contemplated to overcoat the high density hafnia layer with silver prior to coating the PAA'C oxide layer. Silver accelerates crystal growth. It is believed that the silver provides nucleation sites for crystal formation on heating. Acceleration of crystal growth can be observed with silver coatings as thin 100 Å. However, it is generally preferred to employ silver coatings in thicknesses ranging from about 0.1 to 1 μm in thickness. Upon the completion of crystallization no continuous silver layer can be found at the interface of the high density hafnia layer and the crystallized conductive PAA'C oxide layer.

The advantage of employing crystal growth promoting agents is that larger crystal sizes can be realized with less thermal energy input. This reduces the risk of oxidation of the austenitic alloy support and unwanted interactions between the support and the crystalline conductive oxide layer being formed.

While PAA'C oxide conductive layers are less susceptible to degradation on keeping in ambient air than RAC oxide superconductive coatings, the articles of this invention can nevertheless benefit by protecting the crystalline PAA'C oxide conductive layer from contact with contaminants, particularly the moisture in ambient air. One technique for achieving the desired protection is to mount the article in a hermetically sealed housing. Another technique is to encapsulate the crystalline PAA'C oxide layer by coating or molding a plastic encapsulant around the article, such as illustrated by external coating 207 in FIG. 2.

Chatterjee et al U.S. Ser. No. 290,670, filed Dec. 27, 1988, titled A SUPERCONDUCTIVE CERAMIC OXIDE COMBINATION, commonly assigned, now U.S. Pat. No. 4,997,804 reports that alkyl cellulose polymers and polyester ionomer polymers are effective to stabilize superconductive ceramic oxides while other polymers are ineffective.

Polyester ionomers are polyesters which contain at least one ionic moiety.

Such ionic moieties can be provided by either ionic diol recurring units or ionic dicarboxylic acid recurring units, but preferably by the latter. Such ionic moieties can be anionic or cationic in nature, but preferably, they are anionic. Exemplary ionic groups include carboxylic acid, sulfonic acid, quaternary ammonium, disulfonylimino groups, and their salts.

In a preferred form, the amorphous polyesters comprise from about 2 to about 25 mole percent, based on total moles of dicarboxylic acid recurring units, of ionic dicarboxylic acid recurring units.

Ionic dicarboxylic acids found to be particularly useful are those having units represented by the formula:

(III)

wherein each of m and n is 0 or 1 and the sum of m and n is 1; each X is carbonyl; Q has the formula:

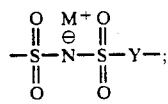
(IV)

Q' has the formula:

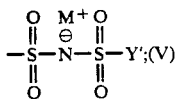
(V)

Y is a divalent aromatic radical, such as arylene (e.g. phenylene, naphthalene, xylylene, etc.) or arylidyne (e.g. phenenyl, naphthylidyne, etc.); Y' is a monovalent aromatic radical, such as aryl, aralkyl or alkaryl (e.g. phenyl, p-methylphenyl, naphthyl, etc.), or alkyl having from 1 to 12 carbon atoms, such as methyl, ethyl, isopropyl, n-pentyl, neopentyl, 2-chlorohexyl, etc., and preferably from 1 to 6 carbon atoms; and M is a solubilizing cation and preferably a monovalent cation such as an alkali metal or ammonium cation.

Exemplary preferred dicarboxylic acids and functional equivalents from which such ionic recurring units are derived are 3,3'-[(sodioimino))disulfonyl]dibenzoic acid; 3,3'-[(potassioimino)disulfonyl]dibenzoic acid; 3,3'-[(lithioimino)disulfonyl]dibenzoic acid; 4,4'-[(lithioimino)disulfonyl]dibenzoic acid; 4,4'-[(sodioimino)-disulfonyl]dibenzoic acid; 4,4'-[(potassioimino)disulfonyl]dibenzoic acid; 3,4'-[(lithioimino)disulfonyl]-dibenzoic acid; 3,4'-[(sodioimino)disulfonyl]dibenzoic acid; 5-[4-chloronaphth-1-ylsulfonyl(sodioimino)sulfonyl]isophthalic acid; 4,4'-[(potassioimino)disulfonyl]-dinaphthoic acid; 5-[p-tolylsulfonyl(potassioimino)-sulfonyl]isophthalic acid; 4-[p-tolylsulfonyl-(sodioimino)-sulfonyl]-1,5-naphthalenedicarboxylic acid; 5-[n-hexylsulfonyl(lithioimino)sulfonyl]isophthalic acid; 2-[phenylsulfonyl(potassioimino)-sulfonyl]terephthalic acid and functional equivalents thereof. These and other dicarboxylic acid useful in forming preferred ionic recurring units are described in Caldwell et al U.S. Pat. No. 3,546,180, the disclosure of which is herein incorporated by reference.

Ionic dicarboxylic acid recurring units can also be derived from 5-sodiosulfobenzene-1,3-dicarboxylic acid, 5-sodiosulfocyclohexane-1,3-dicarboxylic acid, 5-(4-sodiosulfophenoxy)benzene-1,3-dicarboxylic acid, 5-(4-sodiosulfophenoxy)cyclohexane-1,3-dicarboxylic acid, similar compounds and functional equivalents thereof and others described in U.K. Patent Specification No. 1,470,059 (published Apr. 14, 1977).

The amorphous polyesters preferably comprise from about 75 to about 98 mole percent, based on total moles of dicarboxylic acid recurring units, of dicarboxylic acid recurring units which are nonionic in nature. Such nonionic units can be derived from any suitable dicarboxylic acid or functional equivalent which will condense with a diol as long as the resulting polyester is substantially amorphous. Preferably, such units have the formula:

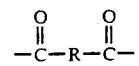
(VI)

wherein R is a saturated or unsaturated divalent hydrocarbon. Preferably, R is alkylene of 2 to 20 carbon atoms, (e.g. ethylene, propylene, neopentylene, 2-chlorobutylene, etc.); cycloalkylene of 5 to 10 carbon atoms, (e.g. cyclopentylene, 1,3-cyclohexylene, 1,4-cyclohexylene, 1,4-dimethylcyclohexylene, etc.); or arylene of 6 to 12 carbon atoms, (e.g. phenylene, xylylene, etc.). More preferably, R is alkylene of 2 to 20 carbon atoms.

Such recurring units are derived from, for example, phthalic acid, isophthalic acid, terephthalic acid, malonic acid, succinic acid, glutaric acid, adipic acid, suberic acid, and 1,3-cyclohexane dicarboxylic acid and functional equivalents thereof. Dicarboxylic acids which have moieties that are sensitive to actinic radiation are also useful. Exemplary radiation sensitive dicarboxylic acids or functional equivalents thereof are described in Arcesi et al U.S. Pat. No. 3,929,489, the disclosure of which is herein incorporated by reference.

The dicarboxylic acid recurring units are linked in a polyester by recurring units derived from difunctional compounds capable of condensing with a dicarboxylic acid or a functional equivalent thereof. Such difunctional compounds include diols of the formula HO—R$^1$—OH wherein R$^1$ is a divalent aliphatic, alicyclic or aromatic radical of from 2 to 12 carbon atoms and includes hydrogen, carbon, and, optionally, ether oxygen atoms.

Such aliphatic, alicyclic, and aromatic radicals include alkylene, cycloalkylene, arylene, alkylenearylene, alkylenecycloalkylene, alkylenebis-arylene, cycloalkylenebisalkylene, arylenebisalkylene, alkylene-oxyalkylene, alkylene-oxy-arylene-oxy-alkylene, arylene-oxy-alkylene, alkylene-oxy-cycloalkylene-oxy-alkylene, etc. Preferably, R$^1$ contains an ether linkage, such as in cycloalkylene-oxy-alkylene or alkylene-oxy-alkylene.

Exemplary diols include ethylene glycol, diethylene glycol, triethylene glycol, 1,3-propane-diol, 1,4-butanediol, 2-methyl-1,5-pentanediol, neopentyl glycol, 1,4-cyclohexanedimethanol, 1,4-bis($\beta$-hydroxyethoxy)-cyclohexane, quinitol, norcamphanediols, 2,2,4,4-tetraalkylcyclobutane-1,3-diols, p-xylene diol and Bisphenol A.

In a preferred embodiment, the substantially amorphous polyesters described herein comprise diol recurring units of either of the formulae

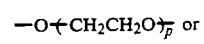
(VII)

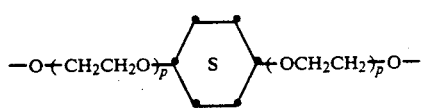
(VIII)

wherein p is an integer from 1 to 4. Such recurring units are present in the polyesters in an amount of at least 50 mole percent, and most preferably from about 50 to 100 mole percent, based on total moles of diol recurring units.

Particularly useful amorphous polyesters include poly[1,4-cyclohexylenedi(oxyethylene)-3,3'-[sodi-oimino)disulfonyl]dibenzoate-co-succinate (5:95 molar ratio)]

poly[1,4-cyclohexylenedi(oxy-ethylene)-co-ethylene (75:25 molar ratio)]

poly{3,3'-[(potassioimino)disulfonyl]-dibenzoate-co-azelate (10:90 molar ratio)} poly{1,4-cyclohexylenedi(oxyethylene)-3,3'-[(sodi-oimino)disulfonyl]-dibenzoate-co-adipate (95:5 molar ratio)} poly{1,4-cyclohexylenedi(oxyethylene)-3,3'-[(sodi-oimino)disulfonyl]dibenzoate-co-3,3'-(1,4-phenylene)dipropionate (20:80 molar ratio)} and poly[p-phenylenebis(oxyethylene)-5-(4-sodiosulfo-phenoxy)-1,3-benzenedicarboxylate-co-terephthalate (30:70 molar ratio)].

Other useful polyester ionomers are disclosed by Noonan et al U.S. Pat. Nos. 4,097,282, 4,291,153, 4,395,475 and 4,419,437 as well as Merrill et al U.S. Pat. No. 4,252,921, here incorporated by reference.

Since the crystalline PAA'C oxides are subject to degradation by moisture, it is particularly surprising that aqueous solutions of these polyester ionomers are effective to stabilize the superconductive ceramic oxides of this invention.

In addition to polyester ionomers it has been observed that alkyl cellulose polymers are also effective to stabilize the superconductive ceramic oxides. Generally any soluble alkyl cellulose can be employed. Preferred alkyl cellulose polymers are those in which the alkyl moiety contains from 1 to 10 carbon atoms, optimally from about 1 to 6 carbon atoms. These polymers are generally recognized to be soluble in most common organic solvents. Specific preferred examples of useful alkyl cellulose are methyl cellulose, ethyl cellulose, n-propyl cellulose, isobutyl cellulose, and n-hexyl cellulose.

EXAMPLES

The invention can be better appreciated by reference to the following detailed examples.

EXAMPLE 1

Austenitic stainless steel UNS number S30100, commonly referred to as 301, was employed as a starting material for forming the support of the article. The 301 stainless steel contained 0.15% carbon, 2.00% manganese, 1.00% silicon, 16–18% chromium, 6.0–8.0% nickel, 0.045% phosphorus and 0.03% sulfur, with the balance of the composition being iron. A flexible foil of the 301 stainless steel approximately 50 $\mu$m in thickness was formed by cold rolling a starting sample. Surface irregularities of the flexible foil were substantially limited to a height of less than 1 $\mu$m.

The flexible foil was degreased using acetone followed by rinsing with deionized water, dried and loaded into an evacuated hafnia coating chamber maintained at a pressure of about 1 to $2 \times 10^{-6}$ torr. To assure a clean deposition surface the flexible foil was lightly etched with an ion beam. A general description of the coating procedure employed is provided by J. J. Cuomo and S. M. Rossnazol, *Nucl. Instr. and Meth.*, B19/20, 903 (1987). A high density hafnia barrier layer having a thickness in the range of from 1.5 to 1.8 $\mu$m was deposited on the cleaned flexible foil at a temperature of 240° to 260° C. by electron beam evaporation of hafnia (99% purity) at a fixed rate of 0.2 to 0.4 nm/sec. To prevent a space charge induced oxygen deficiency a gas stream consisting of 95% Ar and 5% $O_2$ supplied from a $1 \times 10^{-4}$ Torr. Source was passed by a tungsten charge neutralizer filament heated by an electric current and then brought into contact with the hafnia layer as it was being deposited. This improved the adhesion of the hafnia to the flexible foil and annealed localized stresses out of the hafnia layer.

The hafnia layer as initially deposited was in a tetragonal crystal structure and was transformed into a monoclinic crystal structure by annealing at 600° C. for one hour. Scanning electron microscopy revealed a high density hafnia layer devoid of microcracks or other visible discontinuities.

A 2-2-1-2 crystal structure $Bi_2Sr_2CaCu_2O_{8+}$ (where 8+ indicates more than 8 but less than 9 oxygen atoms—i.e., a slight stoichiometric excess) conductive layer was prepared by the following procedure:

A precursor composition containing the conductive oxide coating metals in the required proportions was prepared by mixing the organic precursor compounds bismuth 2-ethylhexanoate, strontium cyclohexanebutyrate, calcium 2-ethylhexanoate and copper 2-ethylhexanoate. The bismuth precursor was prepared as described in EPO 0 334 093, cited above, but with a somewhat varied rotary evaporator treatment that gave a bismuth concentration of 20.8 percent as determined by gravimetric analysis. The strontium cyclohexanebutyrate and calcium 2-ethylhexanoate were purchased from commercial sources and were received with an assay indicating a metal concentration of 19.4 and 5 percent, respectively. The precursor with a copper concentration of 6.31 percent was made by mixing 2.0 g of copper acetate with 8.0 g of 2-ethylhexanoic acid. The individual precursors were mixed in a weight ratio of 6:2.7:2.4:6.04 and dissolved in 2-ethylhexanoic acid by heating to boiling until no solids remained. The precursor composition had a copper concentration of $3.8 \times 10^{-4}$ mole per gram of solution. To enhance grain growth on crystallization a soluble sodium salt was added to the precursor composition to give a final sodium concentration of 2.3 to $3.4 \times 10^{-5}$ mole per gram of solution. Rosin (Kodak 2315 TM) was added as a film forming agent, and the precursor composition was heated slightly until the rosin went into solution.

The precursor composition was spin coated on the high density hafnia layer on the support at 4000 rpm for 20 seconds and then thermally ramped from room temperature to 550° C. in 10 minutes. After 5 minutes of annealing at 550° C., the sample was cooled to room temperature. This process was then repeated 6 times to produce a total of 7 layers, each having a thickness of approximately 0.4 $\mu$m.

After all the layers were formed the sample was further heat treated at 845° C. for 5 to 10 minutes to convert the layers to the desired superconducting 2-2-1-2 crystal structure. X-ray diffraction analysis revealed a highly oriented crystalline film with the crystal c-axes oriented normal to the substrate. The sheet resistance of the conductive oxide coating was about 4 ohms/square at room temperature. Below ambient temperature resistance measurements revealed excellent electrical characteristics. The superconducting onset transition temperature $T_c$ was in the vicinity of 85° K., with $T_o$ being about 70° to 73° K. The critical current density at 4° K. was about $1 \times 10^3$ A/cm$^2$.

EXAMPLE 2

This is a comparative example demonstrating the ineffectiveness of zirconia when substituted for hafnia.

Example 1 was repeated, except that zirconia was substituted for hafnia. The crystalline oxide coating produced was nonconducting. Neither a superconducting onset transition temperature nor superconductivity was observed. Failure was attributed to cracking of the zirconia layers at the elevated temperatures required to form the crystalline oxide film.

EXAMPLE 3

This is a comparative example demonstrating the ineffectiveness of magnesia when substituted for hafnia.

Example 1 was repeated, except that magnesia was substituted for hafnia. A useful coated article could not be produced. The bismuth strontium calcium copper oxide coating pelled from the support on heating to crytallization temperatures. This was attributed to a thermal expansion mismatch between the magnesia and the cuprate layers.

EXAMPLE 4

This is a comparative example demonstrating the necessity of a barrier layer.

Example 1 was repeated, except that the step of forming the hafnia barrier layer was omitted. The crystalline oxide coating produced was nonconducting. Neither a superconducting onset transition temperature nor superconductivity was observed. Failure was attributed to contamination of the crystalline oxide coating by thew austenitic alloy support.

The invention has been described in detail with particular reference to preferred embodiments thereof, but it will be understood that variations and modifications can be effected within the spirit and scope of the invention.

We claim:

1. An article comprised of
   a support,
   a barrier and
   an electrically conductive crystalline 2-2-1-2 or 2-2-2-3 heavy pnictide mixed alkaline earth copper oxide coating, wherein said coating has a thickness of less than 10 $\mu$m,
   characterized in that
   the support is comprised of an austenitic alloy of chromium and one or more group VIII period 4 metals and
   the barrier is comprised of a high density hafnia layer, having a density at least 90 percent of the theoretical density of hafnia and a thickness in the range of from 1 to 3 $\mu$m.

2. An article according to claim 1 further characterized in that said support is flexible and elongated along one major axis.

3. An article according to claim 2 further characterized in that said flexible support has a thickness in the range of from about 5 to 500 $\mu$m.

4. An article according to claim 3 further characterized in that said flexible support has a thickness in the range of from about 10 to 300 $\mu$m.

5. An article according to claim 2 further characterized in that said support is comprised of a flexible tape.

6. An article according to claim 2 further characterized in that said support is comprised of a flexible wire.

7. An article according to claim 1 further characterized in that said support is comprised of austenitic stainless steel.

8. An article according to claim 1 further characterized in that said hafnia layer exhibits a density of at least 99 percent of the theoretical density of hafnia.

9. An article according to claim 8 further characterized in that said hafnia layer is substantially free of coating defects.

10. An article according to claim 1 further characterized in that said crystalline coating is comprised of superconductive crystalline 2-2-1-2 bismuth strontium calcium copper oxide.

11. An article according to claim 1 further characterized in that said crystalline coating is comprised of superconductive crystalline 2-2-2-3 bismuth strontium calcium copper oxide.

12. An article according to claim 1 further characterized in that said barrier layer additionally includes silver interposed between the crystalline layer and the hafnia.

13. A flexible electrically conductive article comprised of
    a support,
    a barrier coated on said flexible support, and
    a uniform metal oxide coating which exhibits a superconducting transition temperature in excess of 80° K. containing a superconductive crystalline 2-2-1-2 or 2-2-2-3 bismuth strontium calcium copper oxide, characterized in that
    said support is resistant to oxidation in air when heated to a temperature of at least 800° C. for 10 minutes and is comprised of a metal alloy exhibiting a face centered cubic crystal structure comprised of one or more group VIII period 4 metals and from 5 to 30 percent by weight chromium,
    said uniform metal oxide coating has a thickness of less than 10 $\mu$m, and
    said barrier is comprised of a hafnia layer having a density at least 90 percent of the theoretical density of hafnia and a thickness in the range of from 1 to 3 $\mu$m.

* * * * *